United States Patent [19]
Barbera

[11] Patent Number: 5,155,383
[45] Date of Patent: Oct. 13, 1992

[54] CIRCUIT AND METHOD OF RESETTING A MASTER/SLAVE FLIPFLOP

[75] Inventor: George E. Barbera, Phoenix, Ariz.

[73] Assignee: Motorola, Inc., Schaumburg, Ill.

[21] Appl. No.: 829,197

[22] Filed: Feb. 3, 1992

[51] Int. Cl.[5] .................. H03K 3/286; H03K 3/289
[52] U.S. Cl. .................. 307/291; 307/272.1; 307/272.2; 307/272.3; 307/289
[58] Field of Search ............ 307/272.1, 272.2, 272.3, 307/291, 289, 362, 530, 363

[56] References Cited

U.S. PATENT DOCUMENTS

| | | | |
|---|---|---|---|
| 3,643,109 | 2/1972 | Skokan | 307/363 |
| 3,646,361 | 2/1972 | Pfiffner | 307/362 |
| 4,506,165 | 3/1985 | Gulati et al. | 307/279 |
| 4,560,888 | 12/1985 | Oida | 307/272.2 |
| 4,578,599 | 3/1986 | Birch et al. | 307/272.2 |
| 4,668,881 | 5/1987 | Piasecki | 307/291 |
| 4,779,009 | 10/1988 | Tsunoi et al. | 307/272.2 |
| 4,868,418 | 9/1989 | Imamura et al. | 307/362 |
| 4,970,406 | 11/1990 | Fitzpatrick et al. | 307/291 |
| 5,001,361 | 3/1991 | Tamamura et al. | 307/289 |
| 5,027,005 | 6/1991 | Kitsuta et al. | 307/289 |
| 5,099,142 | 3/1992 | Barre | 307/272.2 |

FOREIGN PATENT DOCUMENTS

| | | | |
|---|---|---|---|
| 0002369 | 1/1977 | Japan | 307/289 |
| 0035464 | 4/1978 | Japan | 307/272.2 |
| 0134914 | 5/1990 | Japan | 307/272.2 |
| 0134915 | 5/1990 | Japan | 307/272.2 |

Primary Examiner—Andrew J. James
Assistant Examiner—Terry D. Cunningham
Attorney, Agent, or Firm—Robert D. Atkins

[57] ABSTRACT

A master/slave flipflop uses a reset circuit to initialize its output to a known state. A data input signal and a reference signal are received at first and second inputs of a differential transistor input stage respectively for developing first and second output signals having opposite logic states at first and second nodes. A locking circuit locks the logic states of the first and second output signals at the first and second nodes respectively. A reset circuit reduces the second output signal at the second node upon receiving a reset signal to establish a logic low state at the second node and a logic high state at the first node which transfer through the slave portion as the output signals of the flipflop circuit.

5 Claims, 3 Drawing Sheets

CIRCUIT AND METHOD OF RESETTING A MASTER/SLAVE FLIPFLOP

BACKGROUND OF THE INVENTION

The present invention relates in general to flipflop circuits and, more particularly, to a circuit and method of resetting a master/slave flipflop.

Master/slave flipflops are commonly used in electronic circuit design to latch a data input signal at an output in response to a clock signal so that transitions of the data output signal of the flipflop are synchronized to the clock signal. A master/slave type flipflop is responsive to opposite phases of the clock signal whereby the data input signal is latched internally in the master portion of the flipflop during one phase of the clock signal followed by a transfer of the data through the slave portion to the output of flipflop at the opposite phase of the clock signal.

An important feature of the master/slave flipflop is the reset option whereby a reset signal can set the output of the flipflop to a known state, for example, during initialization of the system. Therefore, a need exists for a circuit and method of resetting a master/slave flipflop.

SUMMARY OF THE INVENTION

Briefly stated, the invention comprises a flipflop circuit including a differential transistor input stage having a first input receiving a data signal, a second input receiving a reference signal, and first and second outputs developing first and second output signals having opposite logic states at first and second nodes, respectively. A first means is coupled to the first and second nodes for locking the logic states of the first and second output signals at the first and second nodes respectively. A second means is coupled to the second node for reducing the second output signal upon receiving a reset signal such that the first means establishes a logic low state at the second node and a logic high state at the first node.

In another aspect, the present invention is a method of resetting a master/slave flipflop comprising the steps of receiving a data signal and a reference signal at first and second inputs of a differential transistor input stage respectively and developing first and second output signals having opposite logic states at first and second nodes in response thereto, locking the logic states of the first and second output signals at the first and second nodes respectively, and reducing the second output signal at the second node upon receiving a reset signal for establishing a logic low state at the second node and a logic high state at the first node.

DETAILED DESCRIPTION OF THE PREFERRED EMBODIMENT

Figure 1:
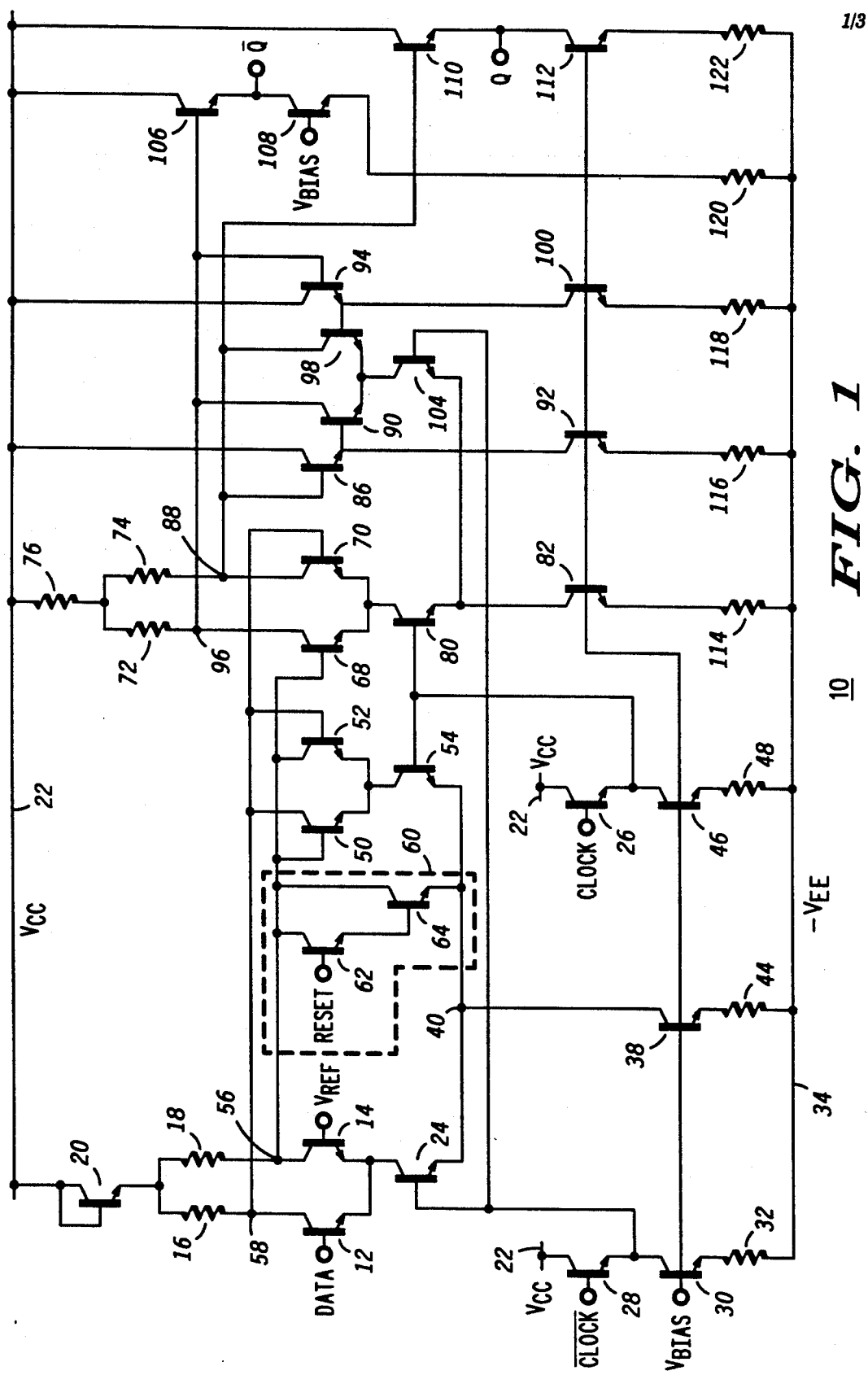
FIG. 1 is a schematic diagram illustrating a first flipflop with a reset circuit.

A master/slave flipflop 10 is shown in FIG. 1 suitable for manufacturing as an integrated circuit using conventional integrated circuit processes. A DATA signal is applied at the base of transistor 12 operating in a differential manner with transistor 14 which receives a reference signal $V_{REF}$ at its base. The DATA signal swings between a logic one ($-1.0$ volts) and a logic zero ($-1.6$ volts). A typical value for $V_{REF}$ is $-1.3$ volts. The collectors of transistors 12 and 14 are coupled through resistors 16 and 18, respectively, and through diode-configured transistor 20 to power supply conductor 22 operating at a positive potential $V_{CC}$ (0.0 volts). The common emitters of transistors 12 and 14 are coupled to the collector of transistor 24.

Flipflop 10 also receives CLOCK and $\overline{\text{CLOCK}}$ signals at the bases of transistors 26 and 28, respectively. The collectors of transistors 26 and 28 are coupled to power supply conductor 22, and the emitter of transistor 28 is coupled to the base of transistor 24 and to the collector of transistor 30. The emitter of transistor 30 is coupled through resistor 32 to power supply conductor 34 operating at a negative potential $-V_{EE}$ ($-5.2$ volts). Transistor 38 includes a collector coupled to the emitter of transistor 24 at node 40, and an emitter coupled through resistor 44 to power supply conductor 34. Transistor 46 includes a collector coupled to the emitter of transistor 26, and an emitter coupled through resistor 48 to power supply conductor 34.

The latching operation for the master portion of flipflop 10 is preformed by transistors 50 and 52 having common emitters coupled through the collector-emitter conduction path of transistor 54 to node 40. The base of transistor 50 is coupled to the collector of transistor 14 at node 56, and the collector of transistor 50 is coupled to the collector of transistor 12 at node 58. The collector of transistor 52 is coupled to node 56, and the base of transistor 52 is coupled to node 58.

A key feature of the present invention is reset circuit 60 for establishing known logic levels at nodes 56 and 58. One embodiment of reset circuit 60 as shown in FIG. 1 includes transistors 62 and 64 having common collectors coupled to node 56. The base of transistor 62 receives a RESET signal, and its emitter is coupled to the base of transistor 64. The emitter of transistor 64 is coupled to node 40.

The aforedescribed circuit constitutes the master portion of master/slave flipflop 10. The slave portion of flipflop 10 begins with differential transistor pair 68 and 70 having bases coupled to node 56 and node 58 as shown in FIG. 1. The collectors of transistors 68 and 70 are coupled through resistors 72 and 74, respectively, and through resistor 76 to power supply conductor 22. The common emitters of transistors 68 and 70 are coupled through the collector-emitter conduction path of transistor 80 to the collector of transistor 82. The base of transistor 80 is coupled to the emitter of transistor 26. Transistor 86 includes a base coupled to the collector of transistor 70 at node 88, a collector coupled to power supply conductor 22, and an emitter coupled to the base of transistor 90 and to the collector of transistor 92. Transistor 94 includes a base coupled to the collector of transistor 68 at node 96, a collector coupled to power supply conductor 22, and an emitter coupled to the base of transistor 98 and to the collector of transistor 100. The collectors of transistors 90 and 98 are coupled to nodes 96 and 88, respectively, and the common emitters are coupled through the collector-emitter conduction path of transistor 104 to the collector of transistor 82. The base of transistor 104 is coupled to the emitter of transistor 28.

The base of transistor 106 is coupled to node 96, while its collector is coupled to power supply conductor 22, and its emitter is coupled to the collector of transistor 108 at the e,ovs/Q/ -output of flipflop 10. The base of transistor 110 is coupled to node 88, while its collector is coupled to power supply conductor 22, and its emitter is coupled to the collector of transistor 112 forming the Q-output of flipflop 10. Current source transistors 30, 38, 46, 82, 92, 100, 108 and 112 receive bias potential $V_{BIAS}$ operating at −3.9 volts. The emitters of transistors 82, 92, 100, 108 and 112 are coupled through resistors 114, 116, 118, 120 and 122, respectively, to power supply conductor 34.

First consider the basic operation of flipflop 10 where a DATA input signal of logic one is applied at the base of transistor 12. When the e,ovs/CLOCK/ signal goes high, transistor 28 turns on and enables the conduction path through differential transistor pair 12–14 via transistor 24. Transistor 12 turns on and pulls node 58 to logic zero while node 56 goes to logic one by way of resistor 18 and diode 20. When the CLOCK signal goes high and the $\overline{CLOCK}$ signal goes low, transistors 26 and 54 conduct and enable differential transistor pair 50–52. The logic one at node 56 turns on transistor 50 and locks the logic zero at node 58. Transistor 52 remains non-conductive. The logic one and logic zero at nodes 56 and 58 turn on transistor 68 and turn off transistor 70. Node 88 goes high through resistors 74 and 76 while transistor 68 forces node 96 to logic zero. Transistor 106 is non-conductive because of the logic zero at node 96 and the $\overline{Q}$-output is pulled low through transistor 108. The logic one at node 88 turns on transistor 110 and pulls the Q-output of flipflop 10 to logic one. Thus, a logic one DATA signal is latched at the Q-output of flipflop 10 upon receiving CLOCK and e,ovs/-CLOCK/ signals.

As part of the present invention, a logic one RESET signal resets the Q-output of flipflop 10 to logic zero and the $\overline{Q}$-output to logic one. Assuming a logic one at node 56 and a logic zero at node 58 as the initial state of flipflop 10, transistor 50 is conducting a current $I_{CS}$ as determined by current source transistor 38. When the logic one RESET signal is applied at the base of transistor 62, transistor 64 turns on and conducts a portion of the current $I_{CS}/2$ or less, previously flowing through transistor 50. Resistors 16 and 18 each begin to conduct current $I_{CS}/2$ causing the potential at node 56 to decrease and the potential at node 58 to increase. Transistor 52 turns on as the potential at node 58 increases and works in conjunction with transistor 64 to pull more current through resistor 18 thereby reducing the potential at node 56 towards a logic zero. As the potential at node 56 falls, transistor 50 conducts less current allowing the potential at node 58 to increase even further. Thus, the combination of transistors 52 and 64 overcome transistor 50 and establish a logic zero at node 56 and a logic one at node 58. Accordingly, transistor 70 conducts and forces node 88 to logic zero turning off transistor 110. The Q-output of flipflop 10 switches to logic zero by transistor 112. Node 96 is pulled high by resistors 72 and 76 thereby turning on transistor 106 and establishing a logic one for the $\overline{Q}$-output of flipflop 10.

Next consider the situation in FIG. 1 where node 56 begins as a logic zero and node 58 as a logic one. A logic one RESET signal turns on transistors 62 and 64 to re-enforce the logic zero at node 56 and logic one at node 58. Again, transistor 70 conducts and forces node 88 to logic zero turning off transistor 110. The Q-output of flipflop 10 remains logic zero. Node 96 remains high keeping transistor 106 on and maintaining a logic one at the $\overline{Q}$-output of flipflop 10.

Another possible condition occurs when the voltage levels at node 56 and node 58 are indeterminate, that is, somewhere between a logic one of −1.0 volts and a logic zero of −1.6 volts. A logic one RESET signal initiates the scenario as described for the case of a preexisting logic one at node 56. Transistor 64 conducts current through resistor 18 thereby lowering the potential at node 56 and increasing the potential at node 58 to eventually turn off transistor 50 and turn on transistor 52. The Q and $\overline{Q}$-outputs of flipflop 10 switch to logic zero and logic one, respectively, as previously discussed.

A "SET" function can be achieved in flipflop 10 by connecting the collectors of transistors 62 and 64 to node 58. When a logic one signal is applied to the base of transistor 62 and after CLOCK and $\overline{CLOCK}$ signals, transistor 64 conducts current through resistor 16 thereby lowering the potential at node 58 and increasing the potential at node 56 to eventually turn off transistor 52 and turn on transistor 50. The Q-output of flipflop 10 switches to logic one and the $\overline{Q}$-output switches to logic zero.

Figure 2:
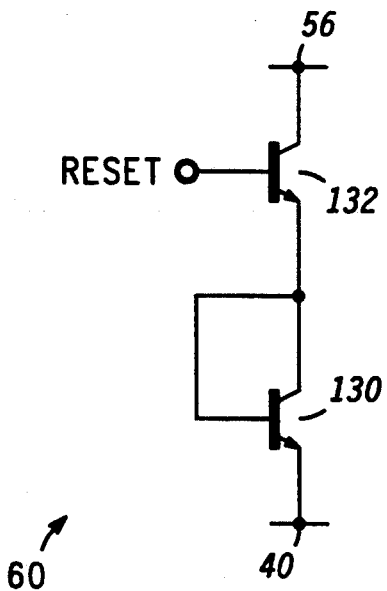
FIG. 2 is a schematic diagram illustrating an alternate reset circuit for the first flipflop of FIG. 1.

An alternate embodiment of reset circuit 60 is shown in FIG. 2 including diode-configured transistor 130 having an emitter coupled to node 40 and a base and collector coupled together to the emitter of transistor 132. The base of transistor 132 receives the RESET signal while its collector is coupled to node 56. The operation of reset circuit 60 shown in FIG. 2 is similar to that described for the embodiment of reset circuit 60 in FIG. 1 where a logic one RESET signal is designed to pull node 56 to logic zero and node 58 to logic one.

The Darlington configuration of transistors 62 and 64 of FIG. 1 improve the noise margin of the base-emitter junction potential ($V_{be}$) of transistor 62 while provide faster operation for transistor 64 by supplying emitter current to its base. Moreover, transistor 62 requires less base current than transistor 132 of FIG. 2 thereby reducing the power consumption associated with the RESET signal. Assuming a beta of 100 for transistor 64, the collector current of transistor 62 is one-hundredth of the collector current flowing through transistor 64 translating to a smaller $V_{be}$ for transistor 62 and correspondingly improve noise margin for the RESET signal. The reset circuit shown in FIG. 2 has the advantage of reduced recovery time when the RESET signal is removed (logic zero) in that transistor 132 of FIG. 2 requires less time to recover from saturation than the Darlington configuration of transistors 62–64 in FIG. 1.

Figure 3:
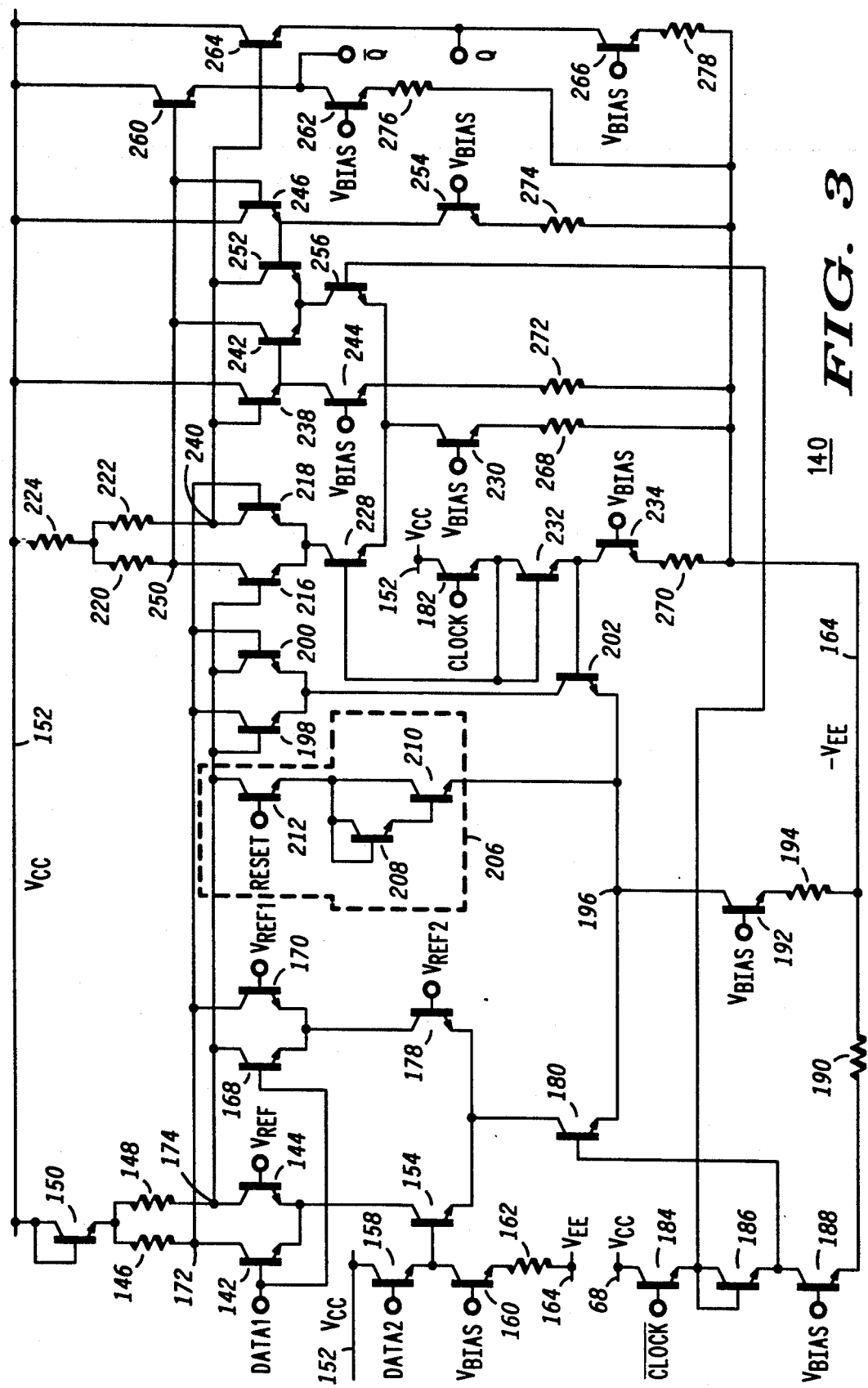
FIG. 3 is a schematic diagram illustrating a second flipflop with a reset circuit.

Turning to FIG. 3, flipflop 140 is shown as an alternate embodiment of a master/slave flipflop. Flipflop 140 performs an exclusive-NOR logical operation on DATA1 and DATA2 input signals and latches the result at the Q-output output upon receiving CLOCK and $\overline{CLOCK}$ signals. The DATA1 signal is applied at the base of transistor 142 operating in a differential manner with transistor 144 which receives a reference signal $V_{REF}$ at its base. The DATA1 and DATA2 signals swing between a logic one (−1.0 volts) and logic zero (−1.6 volts). A typical value for $V_{REF}$ is −1.3 volts. The collectors of transistors 142 and 144 are coupled through resistors 146 and 148, respectively, and through diode-configured transistor 150 to power supply conductor 152 operating at a positive potential $V_{CC}$ (0.0 volts). The common emitters of transistors 142 and 144 are coupled to the collector of transistor 154.

The DATA2 input signal is applied at the base of transistor 158 which includes a collector coupled to power supply conductor 152 and an emitter coupled to the base of transistor 154 and to the collector of transistor 160. The emitter of transistor 160 is coupled through resistor 162 to power supply conductor 164 operating at a negative potential $-V_{EE}$ ($-5.2$ volts). Transistors 168 and 170 operate as a differential pair with the base of transistor 168 receiving the DATA1 signal and the base of transistor 170 receiving a reference potential $V_{REF1}$ of $-1.3$ volts. The collector of transistor 170 is coupled to the collector of transistor 142 at node 172, while the collector of transistor 168 is coupled to the collector of transistor 144 at node 174. The common emitters of transistors 168 and 170 are coupled through the collector-emitter conduction path of transistor 178 to the collector of transistor 180. Transistor 178 receives a reference potential $V_{REF2}$ of $-2.0$ volts at its base.

Flipflop 140 also receives CLOCK and $\overline{\text{CLOCK}}$ signals at the bases of transistors 182 and 184, respectively. The collectors of transistors 182 and 184 are coupled to power supply conductor 152, and the emitter of transistor 184 is coupled through diode-configured transistor 186 to the base of transistor 180. Transistor 188 and resistor 190 at the emitter of transistor 186 operate as a current source referenced to power supply conductor 164. Transistor 192 and resistor 194 at node 196 also operate as a current source.

The latching operation for the master portion of flipflop 140 is preformed by transistors 198 and 200 having common emitters coupled through the collector-emitter conduction path of transistor 202 to node 196. The base of transistor 198 is coupled to the collector of transistor 144 at node 174, and the collector of transistor 198 is coupled to the collector of transistor 142 at node 172. The base of transistor 200 is coupled to node 172, and the collector of transistor 200 is coupled to node 174.

A key feature of the present invention is reset circuit 206 for establishing known logic levels at nodes 172 and 174. One embodiment of reset circuit 206 as shown in FIG. 3 includes diode-configured transistor 208 having a common base and collector coupled to the collector of transistor 210 and to the emitter of transistor 212. The emitter of transistor 208 is coupled to the base of transistor 210, and the emitter of transistor 210 is coupled to node 196. The base of transistor 212 receives a RESET signal, and its collector is coupled to node 174.

The slave portion of flipflop 140 begins with differential transistor pair 216 and 218 having bases coupled to node 174 and node 172 as shown in FIG. 3. The collectors of transistors 216 and 218 are coupled through resistors 220 and 222, respectively, and through resistor 224 to power supply conductor 152. The common emitters of transistors 216 and 218 are coupled through the collector-emitter conduction path of transistor 228 to the collector of transistor 230. Transistor 182 includes an emitter coupled to the base of transistor 228 and through diode-configured transistor 232 to the base of transistor 202 and to the collector of transistor 234. Transistor 238 includes a base coupled to the collector of transistor 218 at node 240, a collector coupled to power supply conductor 152, and an emitter coupled to the base of transistor 242 and to the collector of transistor 244. Transistor 246 includes a base coupled to the collector of transistor 216 at node 250, a collector coupled to power supply conductor 152, and an emitter coupled to the base of transistor 252 and to the collector of transistor 254. The collectors of transistors 242 and 252 are coupled to nodes 250 and 240, respectively, and the common emitters of the same are coupled through the collector-emitter conduction path of transistor 256 to the collector of transistor 230. The base of transistor 256 is coupled to the emitter of transistor 184.

The base of transistor 260 is coupled to node 250, while its collector is coupled to power supply conductor 152, and its emitter is coupled to the collector of transistor 262 at the $\overline{\text{Q}}$-output of flipflop 140. The base of transistor 264 is coupled to node 240, while its collector is coupled to power supply conductor 152, and its emitter is coupled to the collector of transistor 266 forming the Q-output of flipflop 140. Current source transistors 160, 188, 192, 230, 234, 244, 254, 262 and 266 receive bias potential $V_{BIAS}$ operating at $-3.9$ volts. The emitters of transistors 230, 234, 244, 254, 262 and 266 are coupled through resistors 268, 270, 272, 274, 276 and 278, respectively, to power supply conductor 164.

Consider the basic operation of flipflop 140 where the DATA1 and DATA2 input signals are logic zero. With the DATA2 signal at logic zero, transistors 154 and 158 are off and transistor 178 conducts allowing differential transistor pair 168–170 to control nodes 172 and 174. When the $\overline{\text{CLOCK}}$ signal goes high, transistor 184 conducts and turns on transistor 180 thereby enabling the conduction path through differential transistor pair 168–170. The reference potential $V_{REF1}$ turns on transistor 170 because of the logic zero at the base of transistor 168 and forces node 172 to logic zero. Node 174 goes to logic one by way of resistors 148 and diode 150. Alternately, when the DATA1 and DATA2 input signals are logic one differential transistor pair 142–144 control nodes 172 and 174. Again when the $\overline{\text{CLOCK}}$ signal goes high, transistor 184 conducts and turns on transistor 180. The logic one DATA2 signal enables transistor 154 and consequently the conduction path through differential transistor pair 142–144. The logic one DATA1 signal turns on transistor 142 and again forces node 172 to logic zero while node 174 goes to logic one.

When the CLOCK signal goes high and the $\overline{\text{CLOCK}}$ signal goes low, transistors 182, 232 and 202 conduct and enable differential transistor pair 198–200. The logic one at node 174 turns on transistor 198 and locks the logic zero at node 172. Transistor 200 remains nonconductive. The logic one and logic zero at nodes 174 and 172 turn on transistor 216 and turn off transistor 218. Node 240 goes high through resistors 222 and 224 while transistor 216 forces node 250 to logic zero. Transistor 260 is nonconductive because of the logic zero at node 250, and the $\overline{\text{Q}}$-output is pulled low through transistor 262. The logic one at node 240 turns on transistor 264 and pulls the Q-output of flipflop 140 to logic one. Thus, the logic ones or logic zeros for both the DATA1 and DATA2 signals latch a logic one at the Q-output of flipflop 140 upon receiving the CLOCK and $\overline{\text{CLOCK}}$ signals.

If the DATA1 and DATA2 input signals are logic zero and logic one, respectively, transistor 154 conducts and transistors 142–144 control nodes 172 and 174 when the $\overline{\text{CLOCK}}$ signal goes high. The logic zero DATA1 signal allows transistor 144 to pull node 174 to logic zero while node 172 goes to logic one. Alternately, when DATA1 is logic one and DATA2 is logic zero, transistor 178 conducts and differential transistor pair 168–170 control nodes 172 and 174. The logic one DATA1 signal turns on transistor 168 and forces node 174 to logic zero while node 172 goes to logic one.

When the CLOCK signal goes high and the $\overline{\text{CLOCK}}$ signal goes low, transistors 182, 232 and 202 conduct and enable differential transistor pair 198-200. The logic one at node 172 turns on transistor 200 and locks the logic zero at node 174. Transistor 198 remains nonconductive. The logic one and logic zero at nodes 172 and 174 turn on transistor 218 and turn off transistor 216. Node 250 goes high through resistors 220 and 224 while transistor 218 forces node 240 to logic zero. Transistor 264 is nonconductive because of the logic zero at node 240 and the Q-output is pulled low through transistor 266. The logic one at node 250 turns on transistor 260 and pulls the $\overline{Q}$-output of flipflop 140 to logic one. Thus, a logic one and logic zero for the DATA1 and DATA2 signals latch a logic zero at the Q-output of flipflop 140 upon receiving CLOCK and $\overline{\text{CLOCK}}$ signals. In the aforedescribed operation, flipflop 140 performs an exclusive-NOR operation on the DATA1 and DATA2 signal and latches the result at its Q-output and the inverse at the $\overline{Q}$-output.

As part of the present invention, a logic one RESET signal resets the Q-output of flipflop 140 to logic zero and the $\overline{Q}$-output to logic one. Assuming a logic one initially at node 174, transistor 198 is conducting a current $I_{CS}$ as determined by current source transistor 192. When the logic one RESET signal is applied at the base of transistor 212, transistors 208-212 turn on and conduct a portion of the current $I_{CS}$, say $I_{CS}/2$ or less, previously flowing through transistor 198. Resistors 146 and 148 each begin to conduct current $I_{CS}/2$ causing the potential at node 174 to decrease and the potential at node 172 to increase. Transistor 200 turns on as the potential at node 172 increases and works in conjunction with transistors 208-212 to pull more current through resistor 148 thereby reducing the potential at node 174 towards a logic zero. As the potential at node 174 falls, transistor 198 conducts less current allowing the potential at node 172 to increase. Thus, the combination of transistors 200 and 208-212 overcome transistor 198 and establish a logic zero at node 174 and a logic one at node 172. Accordingly, transistor 218 conducts and forces node 240 to logic zero turning off transistor 264. The Q-output of flipflop 140 becomes logic zero through transistor 266. Node 250 is pulled high by resistors 220 and 224 thereby turning on transistor 260 and establishing a logic one for the $\overline{Q}$-output of flipflop 140.

Next consider the situation in FIG. 3 where node 174 begins as a logic zero and node 172 as a logic one. A logic one RESET signal turns on transistors 208-212 to confirm the logic zero at node 174 and logic one at node 172. Again, transistor 218 conducts and forces node 240 to logic zero turning off transistor 264, and the Q-output of flipflop 140 becomes logic zero. Node 250 is pulled high turning on transistor 260 and establishing a logic one for the $\overline{Q}$-output of flipflop 140.

Figure 4:
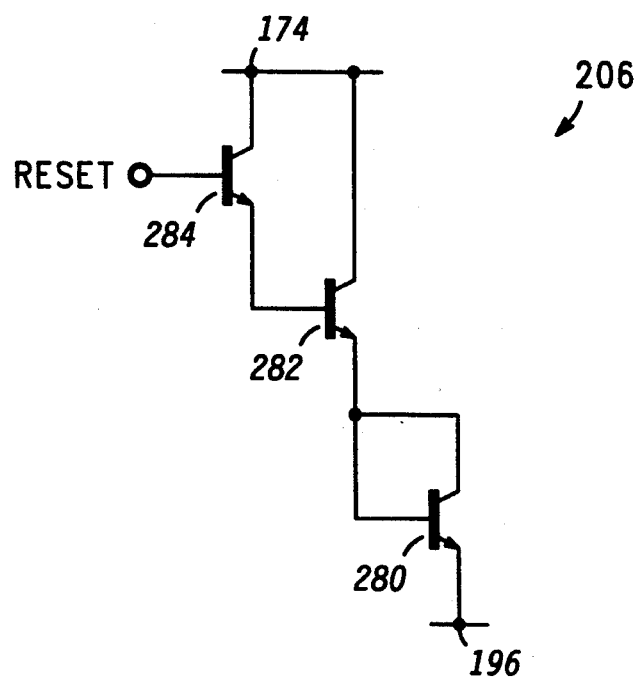
FIG. 4 is a schematic diagram illustrating an alternate reset circuit for the second flipflop of FIG. 3.

An alternate embodiment of reset circuit 206 is shown in FIG. 4 including diode-configured transistor 280 having an emitter coupled to node 196 and a base and collector coupled together to the emitter of transistor 282. The collector of transistor 282 is coupled to node 174 and its base is coupled to the emitter of transistor 284. The base of transistor 284 receives the RESET signal while its collector is coupled to node 174. The operation of reset circuit 206 shown in FIG. 4 is similar to that described for the embodiment of reset circuit 206 in FIG. 3 where a logic one RESET signal is designed to pull node 174 to a logic zero and node 172 to a logic one. The Q and $\overline{Q}$-outputs of flipflop 140 switch to logic zero and logic one, respectively.

Hence, what has been provided is a novel reset circuit for a master/slave flipflop. While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A flipflop circuit, comprising:
   a differential transistor input stage having first and second inputs and first and second outputs, said first input receiving a data signal, said second input receiving a reference signal, said first and second outputs developing first and second output signals having opposite logic states at first and second nodes respectively;
   first means coupled to said first and second nodes for latching said logic states of said first and second output signals at said first and second nodes respectively, said first means including,
   (a) first current supply means having an output at a third node for providing a first current of predetermined magnitude,
   (b) a first transistor having a base, a collector, and an emitter, said base being coupled to said second node, said collector being coupled to said first node,
   (c) a second transistor having a base, a collector, and an emitter, said base being coupled to said first node, said collector being coupled to said second node, and
   (d) a third transistor having a base, a collector, and an emitter, said base receiving a buffered clock signal, said collector being coupled to said emitters of said first and second transistors, said emitter being coupled to said third node; and
   second means coupled to said second node for reducing said second output signal upon receiving a reset signal such that said first means establishes a logic low state at said second node and a logic high state at said first node, said second means including,
   (e) a fourth transistor having a base, a collector, and an emitter, said base receiving said reset signal, said collector being coupled to said second node,
   (f) a fifth transistor having a base, a collector, and an emitter, said base and collector being coupled together to said emitter of said fourth transistor, and
   (g) a sixth transistor having a base, a collector, and an emitter, said collector being coupled to said emitter of said fourth transistor, said base being coupled to said emitter of said fifth transistor, said emitter being coupled to said third node.

2. A flipflop circuit, comprising:
   a differential transistor input stage having first and second inputs and first and second outputs, said first input receiving a data signal, said second input receiving a reference signal, said first and second outputs developing first and second output signals having opposite logic states at first and second nodes respectively;

first means coupled to said first and second nodes for latching said logic states of said first and second output signals at said first and second nodes respectively, said first means including,
  (a) first current supply means having an output at a third node for providing a first current of predetermined magnitude,
  (b) a first transistor having a base, a collector, and an emitter, said base being coupled to said second node, said collector being coupled to said first node,
  (c) a second transistor having a base, a collector, and an emitter, said base being coupled to said first node, said collector being coupled to said second node, and
  (d) a third transistor having a base, a collector, and an emitter, said base receiving a buffered clock signal, said collector being coupled to said emitters of said first and second transistors, said emitter being coupled to said third node; and
second means coupled to said second node for reducing said second output signal upon receiving a reset signal such that said first means establishes a logic low state at said second node and a logic high state at said first node, said second means including,
  (e) a fourth transistor having a base, a collector, and an emitter, said base receiving said reset signal, said collector being coupled to said second node, and
  (f) a fifth transistor having a base, a collector, and an emitter, said base being coupled to said emitter of said fourth transistor, said collector being coupled to said second node, said emitter being coupled to said third node.

3. The flipflop circuit of claim 2 wherein said first means further includes:
second current supply means having an output for providing a second current of predetermined magnitude; and
a sixth transistor having a base, a collector, and an emitter, said base receiving a first clock signal, said collector being coupled to a first power supply conductor, said emitter being coupled to said output of said second current supply means and to said base of said third transistor for providing said buffered clock signal.

4. The flipflop circuit of claim 3 wherein said differential transistor input stage includes:
a seventh transistor having a base, a collector, and an emitter, said base receiving said data signal, said collector being coupled to said first node;
an eighth transistor having a base, a collector, and an emitter, said base receiving a reference signal, said collector being coupled to said second node;
a ninth transistor having a base, a collector, and an emitter, said base and collector being coupled together to said first power supply conductor;
a first resistor coupled between said emitter of said ninth transistor and said collector of said seventh transistor;
a second resistor coupled between said emitter of said ninth transistor and said collector of said eighth transistor;

third current supply means having an output for providing a third current of predetermined magnitude;
a tenth transistor having a base, a collector, and an emitter, said base receiving a second clock signal, said collector being coupled to said first power supply conductor, said emitter being coupled to said output of said third current supply means; and
an eleventh transistor having a base, a collector, and an emitter, said base being coupled to said emitter of said tenth transistor, said collector being coupled to said emitters of said seventh and eighth transistors, said emitter being coupled to said third node.

5. A flipflop circuit, comprising:
a differential transistor input stage having first and second inputs and first and second outputs, said first input receiving a data signal, said second input receiving a reference signal, said first and second outputs developing first and second output signals having opposite logic states at first and second nodes respectively;
first and second current supply means each having an output for providing first and second currents of predetermined magnitude respectively;
a first transistor having a base, a collector, and an emitter, said base being coupled to said second node, said collector being coupled to said first node;
a second transistor having a base, a collector, and an emitter, said base being coupled to said first node, said collector being coupled to said second node;
a third transistor having a base, a collector, and an emitter, said base being coupled to said output of said second current supply means, said collector being coupled to said emitters of said first and second transistors, said emitter being coupled to said output of said first current supply means;
a fourth transistor having a base, a collector, and an emitter, said base being coupled to said output of said second current supply means, said collector being coupled to said emitters of said first and second transistors, said emitter being coupled to said output of said first current supply means; and
circuit means coupled between said second node and said output of said first current supply means for reducing said second output signal upon receiving a reset signal such that said first means establishes a logic low state at said second node and a logic high state at said first node, said circuit means including;
  (a) a fifth transistor having a base, a collector, and an emitter, said base receiving said reset signal, said collector being coupled to said second node,
  (b) a sixth transistor having a base, a collector, and an emitter, said base and collector being coupled together to said emitter of said fifth transistor, and
  (c) a seventh transistor having a base, a collector, and an emitter, said base being coupled to said emitter of said sixth transistor, said collector being coupled to said emitter of said fifth transistor, said emitter being coupled to said output of said first current supply means.

* * * * *